US012550786B2

(12) United States Patent
Hwang et al.

(10) Patent No.: US 12,550,786 B2
(45) Date of Patent: Feb. 10, 2026

(54) STACKED TRANSISTOR ARRANGEMENT AND PROCESS OF MANUFACTURE THEREOF

(71) Applicant: Champion Microelectronic Corporation, Hsinchu (TW)

(72) Inventors: Jeffrey Hwang, Saratoga, CA (US); Hung-Chen Lin, Zhudong Township (TW); Chi-Wu Yao, Zhubei (TW); Cheng-Hsiung Chang, Zhudong Township (TW)

(73) Assignee: Champion Microelectronic Corporation (TW)

( * ) Notice: Subject to any disclaimer, the term of this patent is extended or adjusted under 35 U.S.C. 154(b) by 797 days.

(21) Appl. No.: 17/857,962

(22) Filed: Jul. 5, 2022

(65) Prior Publication Data

US 2023/0068835 A1 Mar. 2, 2023

Related U.S. Application Data

(60) Provisional application No. 63/237,859, filed on Aug. 27, 2021.

(51) Int. Cl.
*H01L 25/065* (2023.01)
*H01L 23/00* (2006.01)

(52) U.S. Cl.
CPC .......... *H01L 25/0657* (2013.01); *H01L 24/48* (2013.01); *H01L 2224/32145* (2013.01);
(Continued)

(58) Field of Classification Search
CPC ................. H01L 25/0657; H01L 24/48; H01L 2224/32145; H01L 2224/48091; H01L 2224/73257; H01L 2924/15311; H01L 23/4952; H01L 23/49562; H01L 23/49575; H01L 24/06; H01L 25/074; H01L 2224/0401; H01L 2224/04042; H01L 24/49; H01L 24/17; H01L 24/16; H01L 24/32; H01L 24/73; H01L 24/81; H01L 24/85; H01L 2224/0603;
(Continued)

(56) References Cited

U.S. PATENT DOCUMENTS

2004/0212072 A1* 10/2004 Wu ......................... H01L 24/32 257/690
2005/0212110 A1* 9/2005 Kato ....................... H01L 24/29 257/E23.114
(Continued)

FOREIGN PATENT DOCUMENTS

KR 20190099815 A * 8/2019

*Primary Examiner* — Teresa M. Arroyo
(74) *Attorney, Agent, or Firm* — Derek J. Westberg, Esq.

(57) ABSTRACT

A stacked transistor arrangement and process of manufacture thereof are provided. Switched electrodes of first and second transistor chips are accessible on opposite sides of the first and second transistor chips. The first and second transistor chips are stacked one on top of the other. Switched electrodes of adjacent sides of the transistor chips are coupled together by a conductive layer positioned between the first and second transistor chips. Switched electrodes on sides of the first transistor chip and the second transistor chip that are opposite the adjacent sides are coupled to a lead frame by bond wires or solder bumps.

11 Claims, 5 Drawing Sheets

100
122 122 122 122
102
106
120
120
124 124 124
110 110 110 110
104
118
112 Gate
114 Source
116 Drain
108

(52) U.S. Cl.
CPC ............... *H01L 2224/48091* (2013.01); *H01L 2224/73257* (2013.01); *H01L 2924/15311* (2013.01)

(58) Field of Classification Search
CPC . H01L 2224/13101; H01L 2224/16225; H01L 2224/16245; H01L 2224/17106; H01L 2224/48227; H01L 2224/48247; H01L 2224/49111; H01L 2224/73253; H01L 2224/73265; H01L 2224/81801; H01L 2924/00014; H01L 2224/45099; H01L 2924/014
See application file for complete search history.

(56) References Cited

U.S. PATENT DOCUMENTS

2006/0238961 A1* 10/2006 Saita ....................... H01L 23/50
257/E23.079
2014/0264804 A1* 9/2014 Terrill ..................... H01L 24/36
257/676
2015/0001739 A1* 1/2015 Chiu ....................... H01L 24/92
257/782
2016/0113144 A1* 4/2016 Ye ....................... H01L 21/4871
361/709
2017/0110383 A1* 4/2017 Huang ................ H01L 23/3135

* cited by examiner

STACKED TRANSISTOR ARRANGEMENT AND PROCESS OF MANUFACTURE THEREOF

This application claims priority of U.S. Provisional Application No. 63/237,859, filed Aug. 27, 2021, the entire contents of which are hereby incorporated by reference.

BACKGROUND OF THE INVENTION

The present invention relates to the field of transistor semiconductor devices. More particularly, the present invention relates to high-power transistors.

Transistors, such as Metal-Oxide-Semiconductor Field-Effect Transistors (MOSFETs), have limited power handling capacity in conventional form. Specialized power MOSFET transistors have been developed that have increased power handling capacity. For example, Vertical Diffused MOS (VDMOS) is a type of power MOSFET. These devices are referred to as "vertical" devices because the source electrode is positioned generally over the drain electrode. This is in contrast to "lateral" devices which have a generally planar structure. Such vertical devices tend to occupy less area than planar devices having equivalent power handling capacity. While such vertical devices have increased power capacities as compared to conventional transistors, there remains a need for transistors having even greater power handling capacities.

SUMMARY OF THE INVENTION

The present invention provides a stacked transistor arrangement and process of manufacture thereof. Switched electrodes (drain and source electrodes) of first and second transistor chips are accessible on opposite sides of the first and second transistor chips. The first and second transistor chips are stacked one on top of the other. Switched electrodes of adjacent sides of the transistor chips (e.g., the drain electrodes) are coupled together by a conductive layer positioned between the first and second transistor chips. Switched electrodes on opposite sides of the first transistor chip and the second transistor chip, the opposite sides being opposite the adjacent sides (e.g., the source electrodes) are coupled to a lead frame by bond wires and/or solder bumps. Control electrodes (gate electrodes) may also be coupled to the lead frame by bond wires and/or solder bumps. These and other aspects are described in more detail herein.

BRIEF DESCRIPTION OF THE DRAWINGS

The present invention is described with respect to particular exemplary embodiments thereof and reference is accordingly made to the drawings in which.

DETAILED DESCRIPTION OF A PREFERRED EMBODIMENT OF THE INVENTION

Figure 1:
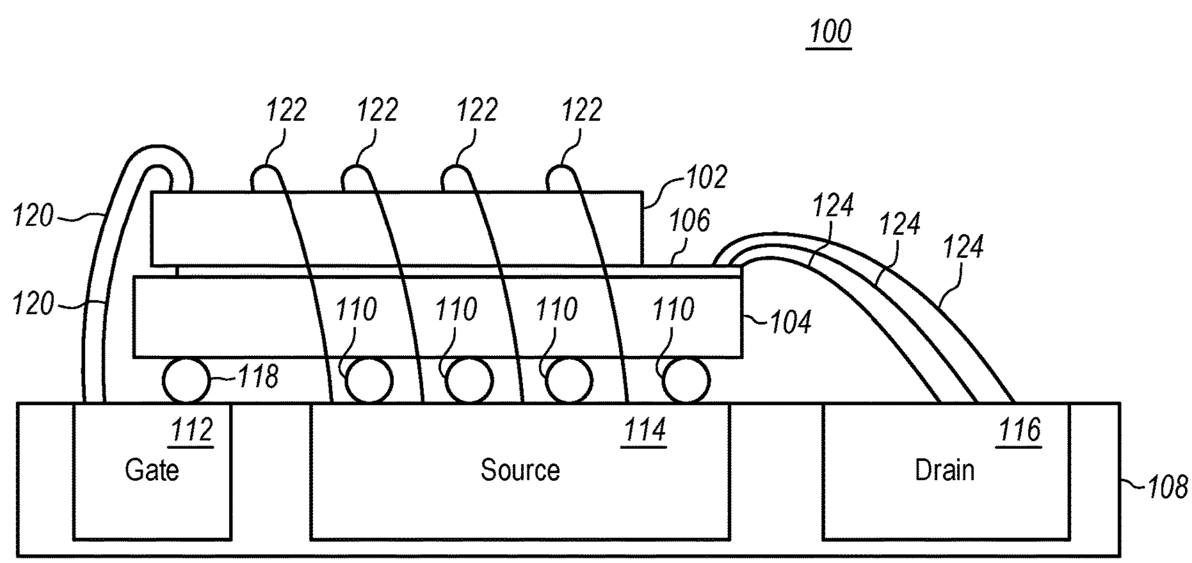
FIG. 1 illustrates a block diagram of a stacked transistor arrangement in accordance with an embodiment of the present invention.

The present invention is directed toward a stacked transistor arrangement and process of manufacture thereof. A first ("upper") transistor chip (also referred as a "die") is positioned or "stacked" on top of a second ("lower") transistor chip (or "die"). The first and second transistor chips preferably comprise vertical devices such that the drain and source electrodes (also referred to as "terminals") for each transistor are accessible on opposite sides of the die. The gate electrode for each transistor can be accessible on either side of each die but are preferably accessible on the same side as the source electrode. Each chip or die preferably comprises multiple transistors.

In accordance with an embodiment of the invention, the first and second transistor chips are positioned such that the sides having the drain electrodes are adjacent to each other. In this case, the drain electrodes of the first (upper) transistor chip can be electrically coupled to the drain electrodes of the second (lower) transistor chip by a conductive layer positioned between the first and second transistor chips. The source electrodes of the first transistor chip may be electrically coupled to a lead frame by bond wires. The source electrodes of the second transistor chip may be electrically coupled to the lead frame by solder bumps. The gate electrodes of the first and second transistor chips may be coupled to the lead frame by bond wires, solder bumps or both. For example, the gate electrodes of the first transistor chip may be coupled to the lead frame by bond wires while the gate electrodes of the second transistor chip may be coupled to the lead frame by solder bumps. Bond wires may also be used to couple the conductive layer (and therefore the drain electrodes) to the lead frame.

The gate electrodes of the transistors may be referred as "control" terminals. The drain and source electrodes of the transistors may be collectively referred to as "switched" or "controlled" terminals. Thus, a voltage applied to the control terminal of a transistor determines conductivity between its switched or controlled terminals.

In an embodiment, the positions of the drain and source electrodes of the first and second chips described above may be interchanged. In other words, the source electrodes of the first transistor chip may be coupled to the source electrodes of the second transistor chip by the conductive layer, while the drain electrodes of the first transistor chip may be coupled to the lead frame by bond wires and the drain electrodes of the second transistor chip may be coupled to the lead frame by solder bumps. Thus, controlled terminals on a first side of first transistor chip can be coupled to controlled terminals on a first side of second transistor chip, while controlled terminals on second side of first transistor chip can be coupled to the lead frame by bond wires and the controlled terminals on the second side of second transistor chip can be coupled to the lead frame by solder bumps, the second side of each chip being opposite the first side of each chip. Control terminals can be coupled to the lead frame by bond wires, solder bumps or both. For example, the control terminals of the first transistor chip may be coupled to the lead frame by bond wires while the control terminals of the second transistor chip may be coupled to the lead frame by solder bumps In an embodiment, the first and second transistor chips are of different sizes. Preferably, the second (lower) chip is larger than the first (upper) chip. This provides exposed surface area of the lower chip that can be used to attach bonding wires from the second chip to the lead frame. More particularly, this exposed surface is preferably located on the upper surface of the second chip. This exposed surface can be fully or partially covered by a conductive layer.

The transistors of the first and second chips preferably comprise Super Junction MOS (SJ MOS) devices though it will be apparent that other types of vertical devices can be incorporated. For example, the first and second chips may incorporate Vertical Diffused MOS (VDMOS) devices.

The stacked transistor arrangement in accordance with embodiments of the present invention can be used in a wide variety of applications requiring high-power transistors. For example, embodiments of the present invention can be used in synchronous rectifiers that synchronously rectify an alternating current (AC) input voltage to produce a direct current (DC) rectified voltage. As another example, embodiments of the present invention can be used to replace gallium nitride (GaN) transistors in applications that call for the use of GaN transistors.

FIG. 1 illustrates a block diagram of a stacked transistor arrangement 100 in accordance with an embodiment of the present invention. The stacked transistor arrangement 100 includes a first (upper) transistor chip 102 and a second (lower) transistor chip 104. The upper transistor chip 102 and the lower transistor chip 104 each comprise a number of transistors having drain, source and gate electrodes. In an embodiment, the gate and source electrodes of the upper transistor chip 102 are located on an upper surface of the transistor chip 102 while the drain electrodes of the upper transistor chip 102 are located on a lower surface of the transistor chip 102. Also, the gate and source electrodes of the lower transistor chip 104 are located on a lower surface of the transistor chip 104 while the drain electrodes of the lower transistor chip 104 are located on an upper surface of the transistor chip 104.

As shown in FIG. 1, the upper transistor chip 102 is positioned above or, more particularly, on top of the lower transistor chip 104. An electrically conductive layer 106 is positioned between the upper transistor chip 102 and the lower transistor chip 104. The conductive layer 106 electrically couples the drain electrodes of the upper transistor chip 102 to the drain electrodes of the lower transistor chip 104.

Also shown in FIG. 1 is that the lower transistor chip 104 is positioned above or, more particularly, on top of a lead frame 108. Electrically conductive solder balls or "bumps" 110 are positioned between the lower transistor chip 104 and the lead frame 108. The lead frame 108 comprises at least a gate terminal 112, a source terminal 114 and a drain terminal 116. The solder balls 110 electrically couple the source electrodes of the lower transistor chip 104 to the source terminal 114 of the lead frame 108. One or more electrically conductive solder balls 118 are also positioned between the lower transistor chip 104 and the lead frame 108. As shown in FIG. 1, the solder balls 118 electrically couple the gate electrodes of the lower transistor chip 104 to the gate terminal 112 of the lead frame 108. The lead frame 108 may comprise metallic wires or conductive coatings that electrically connect the solder balls 110 and 118 to the source terminal 114 and the gate terminal 110, respectively. The terms "solder bumps" and "solder balls" are used herein to refer to solder bumps, solder balls, copper pillar solder bumps and other similar technologies for electrically connecting device terminals using solder or fusible metal alloy.

FIG. 1 also illustrates electrically conductive bond wires. More particularly, bond wires 120 electrically couple the gate electrodes of the upper transistor chip 102 to the gate terminal 112 of the lead frame 108. Bond wires 122 electrically couple the source electrodes of the upper transistor chip 102 to the source terminal 114 of the lead frame 108. Bond wires 124 electrically couple the drain electrodes of the upper transistor chip 102 and the lower transistor chip 104 to the drain terminal 116 of the lead frame 108. This may be accomplished by attaching the bond wires 124 to the conductive layer 106.

For purposes of illustration, elements of FIG. 1 are not necessarily drawn to scale. For example, the transistor chips 102 and 104 are shown having greater thickness then their expected actual thickness. Also, in practice, the number of solder balls 110 and 118 and bond wires 120, 122 and 124 can be expected to greater than the number shown in FIG. 1.

Figure 2:
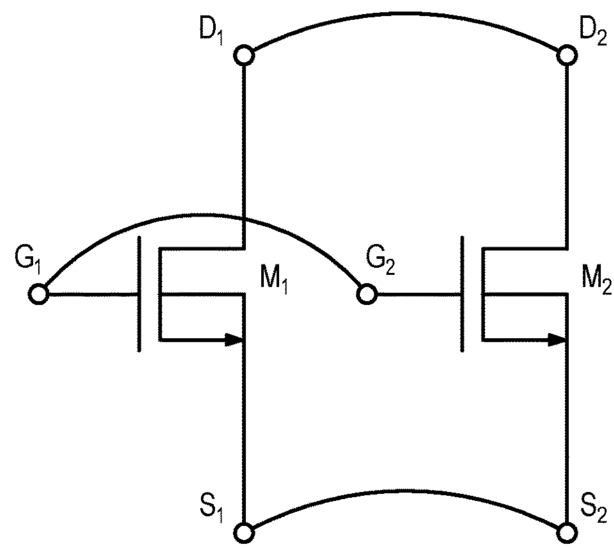
FIG. 2 illustrates a circuit diagram of a stacked transistor arrangement in accordance with an embodiment of the present invention.

FIG. 2 illustrates a circuit diagram of a stacked transistor arrangement in accordance with an embodiment of the present invention. A transistor $M_1$ shown in FIG. 2 represents transistors of the upper transistor chip 102, while a transistor $M_2$ shown in FIG. 1 represents transistors of the lower transistor chip 104. As shown in FIG. 2, a gate terminal $G_1$ of the transistor $M_1$ is coupled to a gate terminal $G_2$ of the transistor $M_2$. A drain terminal $D_1$ of the transistor $M_1$ is coupled to a drain terminal $D_2$ of the transistor $M_2$. A source terminal $S_1$ of the transistor $M_1$ is coupled to a source terminal $S_2$ of the transistor $M_2$. Therefore, the transistors $M_1$ and $M_2$ are coupled in parallel.

Figure 3:
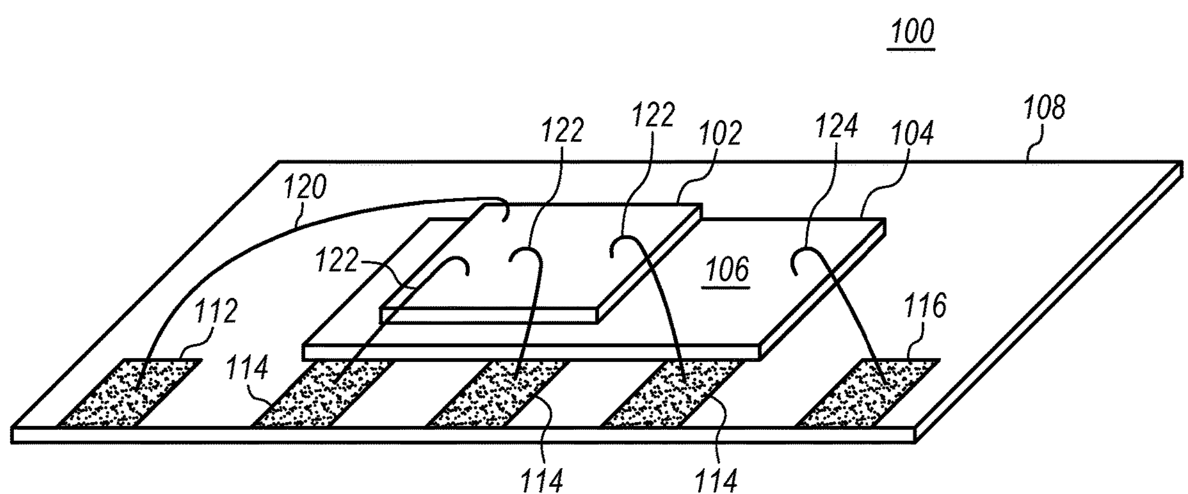
FIG. 3 illustrates a perspective view of a stacked transistor arrangement in accordance with an embodiment of the present invention.

FIG. 3 illustrates a perspective view of a stacked transistor arrangement 100 in accordance with an embodiment of the present invention. Like elements of FIG. 3 are given the same references as those in FIG. 1. Thus, as shown in FIG. 3, the upper transistor chip 102 is positioned on top of the lower transistor chip 104. The conductive layer 106 is positioned between the upper transistor chip 102 and the lower transistor chip 104. The lower transistor chip 104 is positioned on top of the lead frame 108 (though the solder bumps between the lower transistor chip 104 and the lead frame 108 are not shown in FIG. 3). Bond wire 120 couples gate electrodes of the transistor chip 102 to the gate terminal 112 of the lead frame 108. Bond wires 122 couple source electrodes of the transistor chip 102 to source terminals 114 of the lead frame 108. Bond wire 124 couples drain electrodes of the transistor chips 102 and 104 to the drain terminal 116 of the lead frame 108. FIG. 3 differs from FIG. 1 in that FIG. 3 shows multiple source terminals 114. It will be apparent that a different number of any of the elements shown in FIGS. 1 and 3 may be incorporated. For example, more or fewer gate, source or drain terminals may be provided in the lead frame 108. As another example, more or fewer bond wires 120, 122 and 124 may be provided. As yet another example, the upper transistor chip 102 may be divided into one or more chips that are positioned on top of the lower transistor chip 104. Similarly, the lower transistor chip 104 may be divided into one or more chips that are positioned between the upper transistor chip 102 and lead frame 108.

Figure 4:
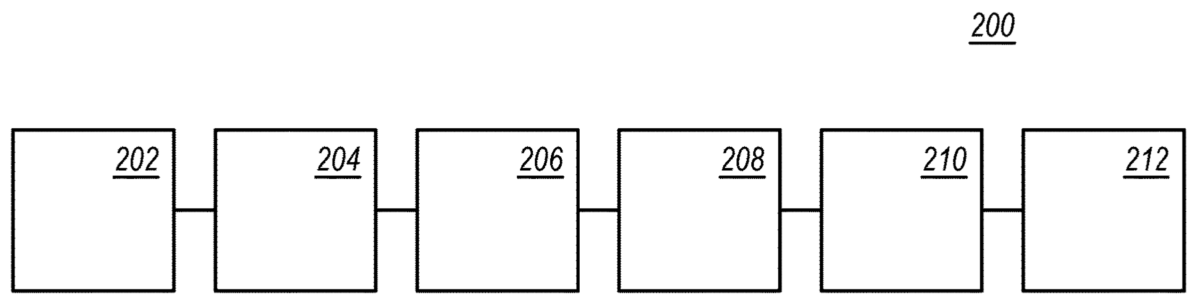
FIG. 4 illustrates a method of manufacturing a stacked transistor arrangement in accordance with an embodiment of the present invention.

FIG. 4 illustrates a method 400 of manufacturing a stacked transistor arrangement in accordance with an embodiment of the present invention. In a first step 402, a semiconductor wafer incorporating transistors is provided. This can include providing two wafers, in which case, one of wafers can be designated to be cut into upper transistor chips 102 (FIGS. 1 and 3) while the other wafer can be designated to be cut into lower transistor chips 104 (FIGS. 1 and 3). In a step 204, the wafer designated for lower transistor chips 104 is treated to form the solder bumps 110 (FIG. 1) and 118 (FIG. 1). The treatment performed in step 204 may also be referred to a "bumping."

Figure 5:
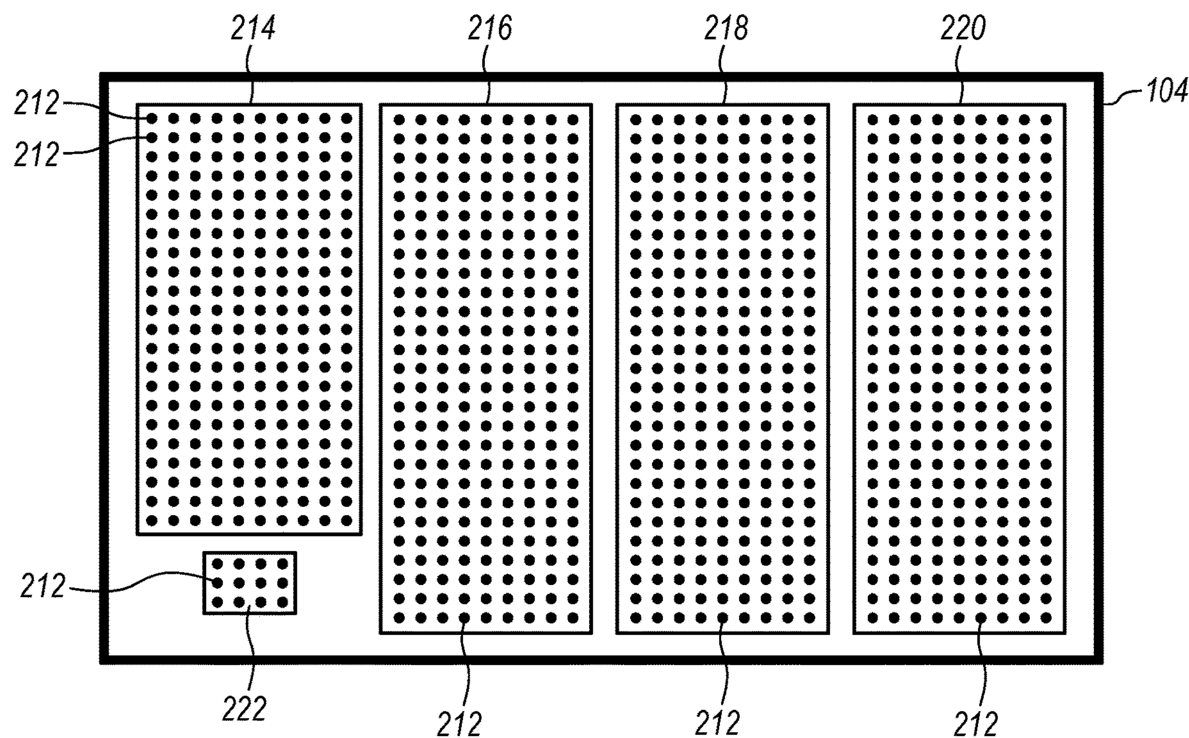
FIG. 5 illustrates a bottom view of a transistor die in accordance with an embodiment of the present invention.

FIG. 5 illustrates a bottom view of a transistor die in accordance with an embodiment of the present invention. FIG. 5 shows a possible arrangement of solder balls or bumps 212 applied to a single die 104 of the wafer during the bumping step 204 (FIG. 4). As shown in FIG. 5, solder bumps 212 may be applied to areas or regions 214, 216, 218, 220 and 222 of the die 104. The regions 214 216, 218 and 220 may correspond to source electrodes while the area 222 may correspond to gate electrodes. As shown in FIG. 5, multiple solder balls 212 may be included in each of the regions. The source regions 214 216, 218 and 220 tend to require higher density of solder balls than the gate region 222 due to the greater current throughput of the source electrodes as compared to the gate electrodes.

Figure 6:
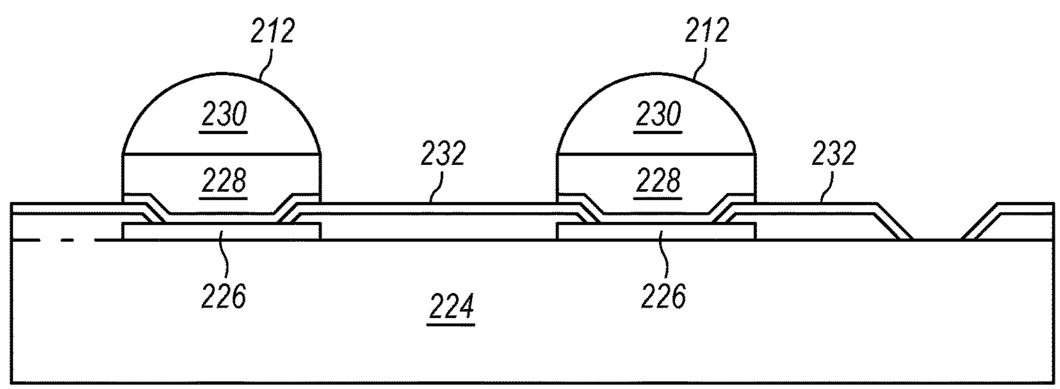
FIG. 6 illustrates a side view of solder bumps for use in a stacked transistor arrangement in accordance with an embodiment of the present invention.

FIG. 6 illustrates a side view of solder balls or bumps 212 for use in a stacked transistor arrangement in accordance with an embodiment of the present invention. The bumps 212 are positioned on top of gate or source semiconductor material 224. More particularly, beneath each bump 212 is a metallic material 226 and in contact with the semiconductor material 226. The metallic material 226 can include copper (Cu) and/or tin (Sn). Each bump 212 is preferably composed of a copper layer 228 and a tin (Sn) layer 230. Between the bumps 212 is a passivation layer 232 which can be composed of polymide (PI).

Returning to FIG. 4, in a step 206 grinding and coating are performed on the wafers. This can include grinding and smoothing the lower surface of the wafer designated to be cut into upper transistor chips 102. This can also include grinding and smoothing the upper surface of the wafer designated to be cut into lower transistor chips 104. These surfaces would generally include the surfaces upon which the drain electrodes are accessible for both wafers. The coating applied in this step can include titanium (Ti), nickel (Ni), and/or silver (Ag). This coating is preferably applied to one or both of the lower surface of the wafer designated to be cut into upper transistor chips 102 and the upper surface of the wafer designated to be cut into lower transistor chips 104. This coating serves as the conductive layer 106 shown in FIGS. 1 and 3.

In a step 208, the wafers are cut into individual dies. This can be accomplished using a wafer saw.

In a step 210, the upper transistor chip 102 is mounted to the lower transistor chip 104. This step can include orienting the transistor chips 102 and 104 so that the lower surface of the upper transistor chip 102 is facing the upper surface of the lower transistor chip 104. This step can also include aligning the upper transistor chip 102 and the lower transistor chip 104 and mounting them together once properly aligned.

The step 210 can also include mounting the lower transistor chip 104 to the lead frame 108. This will generally include orienting the transistor chip 104 so that the lower surface of the lower of the transistor chip 102 is facing an upper mounting surface of the lead frame 108. This step can also include aligning the solder bumps on the lower surface of the lower transistor chip 104 with the lead frame 108 and mounting them together once properly aligned.

In a step 212 wire bonding is performed. This will generally include attaching the bond wires 120, 122 and 124 as shown in FIGS. 1 and 3.

Figure 7:
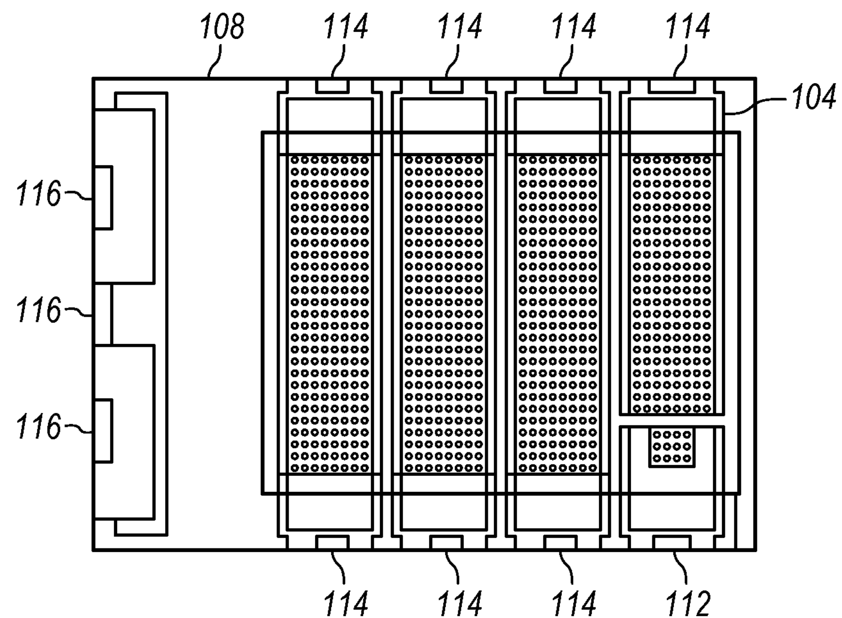
FIG. 7 illustrates a top cut away view of a stacked transistor arrangement in accordance with an embodiment of the present invention.
Figure 8:
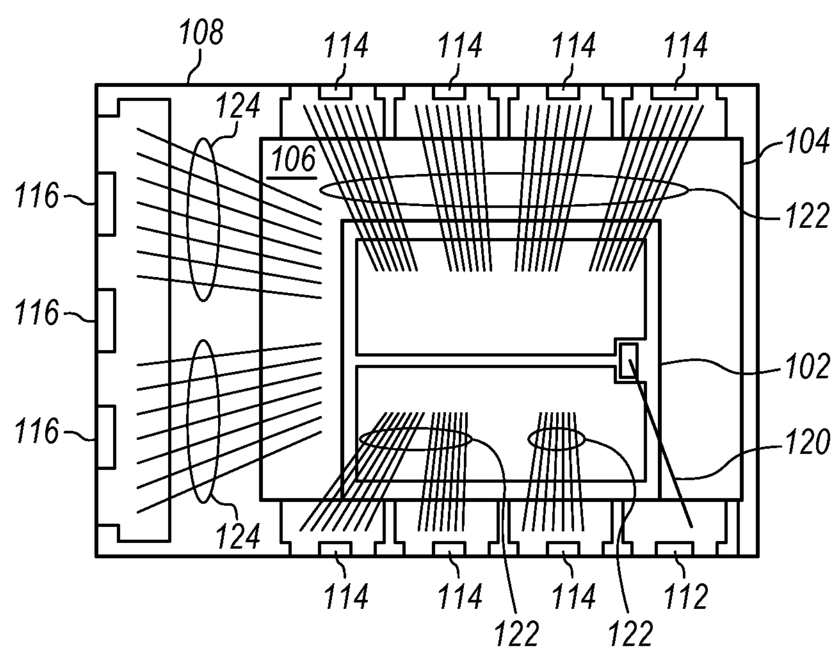
FIG. 8 illustrates a top view of a stacked transistor arrangement in accordance with an embodiment of the present invention.

FIG. 7 illustrates a top cut away view of a stacked transistor arrangement in accordance with an embodiment of the present invention. FIG. 7 shows the lower transistor die 104 and, therefore, appears somewhat similar to the view shown in FIG. 4. However, because FIG. 7 shows the top view, it appears essentially as a mirror image of FIG. 4 which shows a bottom view. FIG. 8 illustrates a top view of a stacked transistor arrangement in accordance with an embodiment of the present invention. FIG. 8 shows the upper transistor die 102 and lower transistor die 104, as well as bond wires 120, 122, and 124. In addition to the above-described components, FIGS. 7 and 8 additionally show: conductive layer 106; lead frame 108; gate, source and drain terminals 112, 114 and 116, respectively;

The foregoing detailed description of the present invention is provided for the purposes of illustration and is not intended to be exhaustive or to limit the invention to the embodiments disclosed. Accordingly, the scope of the present invention is defined by the appended claims.

What is claimed is:

1. A stacked transistor arrangement comprising:

a first transistor chip having a first side and a second side wherein drain and source switched electrodes of the first transistor chip are accessible on opposite sides of the first transistor chip, and wherein control electrodes of the first transistor chip are accessible on the first side of the first transistor chip;

a second transistor chip having a first side and a second side wherein drain and source switched electrodes of the second transistor chip are accessible on opposite sides of the second transistor chip, and wherein control electrodes of the second transistor chip are accessible on the first side of the second transistor chip, and further wherein the second side of the first transistor chip is positioned adjacent to the second side of the first transistor chip and wherein switched electrodes of the second side of the first transistor chip and switched electrodes of the second side of the second transistor chip are coupled together by a conductive layer positioned between the first transistor chip and the second transistor chip; and a lead frame, wherein the drain electrodes of the first and second transistor chips are electrically coupled together and to a drain terminal of the lead frame, and the source electrodes of the first and second transistor chips are electrically coupled together and to a source terminal of the lead frame, and further wherein the control electrodes of the first and second transistor chips are electrically coupled together and to a control terminal of the lead frame.

2. The stacked transistor arrangement according to claim 1, wherein the switched electrodes of the first side of the first transistor chip are coupled to the lead frame by one or more bonding wires and wherein the switched electrodes of the first side of the second transistor chip are coupled to the lead frame by one or more solder bumps.

3. The stacked transistor arrangement according to claim 1, wherein the second transistor chip is larger than the first transistor chip thereby a portion of an upper surface of the second transistor chip is exposed.

4. The stacked transistor arrangement according to claim 3, wherein the switched electrodes of the second side of the second transistor chip are coupled to the lead frame by one or more bond wires attached to the exposed portion of the upper surface of the second transistor chip.

5. The stacked transistor arrangement according to claim 4, wherein the one or more bond wires attached to the exposed portion of an upper surface of the second transistor chip are attached to the conductive layer, the conductive layer covering at a least a portion of the exposed portion of the upper surface of the second transistor chip.

6. The stacked transistor arrangement according to claim 1, wherein the control electrodes of the first transistor chip and the switched electrodes of the first side of the first transistor chip are coupled to the lead frame by bond wires.

7. The stacked transistor arrangement according to claim 1, wherein the control electrodes of the second transistor chip and the switched electrodes of the first side of the second transistor chip are coupled to the lead frame by solder bumps.

8. The stacked transistor arrangement according to claim 1, wherein the first and second transistor chips comprise MOSFET devices.

9. The stacked transistor arrangement according to claim 1, wherein the first and second transistor chips comprise SJ MOS devices.

10. The stacked transistor arrangement according to claim 1, wherein the drain electrodes of the first transistor chip and the drain electrodes of the second transistor chip are coupled together by the conductive layer.

11. The stacked transistor arrangement according to claim 1, wherein the source electrodes of the first transistor chip and the source electrodes of the second transistor chip are coupled together by the conductive layer.

* * * * *